(12) United States Patent
Liang et al.

(10) Patent No.: US 11,119,354 B2
(45) Date of Patent: Sep. 14, 2021

(54) DISPLAY PANEL, METHOD FOR MANUFACTURING THE SAME AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Cuicui Liang, Beijing (CN); Bin Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/852,874

(22) Filed: Apr. 20, 2020

(65) Prior Publication Data
US 2021/0063824 A1 Mar. 4, 2021

(30) Foreign Application Priority Data
Aug. 29, 2019 (CN) .......................... 201910807388.9

(51) Int. Cl.
*G02F 1/1335* (2006.01)
*G02F 1/1337* (2006.01)
*G02F 1/137* (2006.01)

(52) U.S. Cl.
CPC .... *G02F 1/133528* (2013.01); *G02F 1/13725* (2013.01); *G02F 1/133711* (2013.01)

(58) Field of Classification Search
CPC ............... G02F 1/133528; G02F 1/137; G02F 1/13725; G02F 1/133711
See application file for complete search history.

(56) References Cited

U.S. PATENT DOCUMENTS

| 6,084,647 | A | * | 7/2000 | Hatano | G02B 30/25 349/15 |
| 2009/0230345 | A1 | * | 9/2009 | Saija | C08F 283/12 252/8.57 |
| 2016/0070135 | A1 | * | 3/2016 | Im | G02F 1/1341 349/96 |
| 2020/0209681 | A1 | * | 7/2020 | Wang | G02F 1/133617 |

* cited by examiner

*Primary Examiner* — Dung T Nguyen
(74) *Attorney, Agent, or Firm* — Nath, Goldberg & Meyer; Joshua B. Goldberg (57) ABSTRACT

The present disclosure provides a display panel, a method for manufacturing the same and a display device. The display panel includes a substrate and a plurality of pixels provided on the substrate, each of the pixels includes a display region and a transparent region, a light emitting device is provided in the display region, the display panel further includes a polarization layer provided in the display region and the transparent region, and at a light exiting side of the light emitting device departing from the substrate, a portion of the polarization layer located in the display region is configured to absorb external environment light, and another portion of the polarization layer located in the transparent region is configured to transmit the external environment light.

16 Claims, 7 Drawing Sheets

DISPLAY PANEL, METHOD FOR MANUFACTURING THE SAME AND DISPLAY DEVICE

CROSS-REFERENCE TO RELATED APPLICATIONS

The present application claims the priority of Chinese Patent Application No. 201910807388.9, filed on Aug. 29, 2019, the contents of which are incorporated herein in their entirety by reference.

TECHNICAL FIELD

The present disclosure relates to the field of display technology, and particularly relates to a display panel, a method for manufacturing the display panel and a display device.

BACKGROUND

With development of display technology, various new techniques are emerging, and a transparent display technique is more and more concerned by people due to transparence of a display panel. A transparent display panel is a display panel through which a background behind the display panel can be seen. Generally, the transparent display panel has a display region and a transparent region. The transparent region has a high light transmissivity and can allow external environment light to transmit through. The display region is provided with a light emitting device therein, a driving device is provided below the light emitting device, and after the external environment light irradiates the display region, the external environment light would be reflected by the light emitting device and the driving device, particularly reflected by an electrode of the light emitting device, so that a display effect is affected. A polarizer (POL) may be added to absorb the external environment light and prevent the external environment light from being reflected by the light emitting device and the driving device, but the polarizer may reduce the light transmissivity of the transparent region of the display panel, thereby affecting transparency of the display panel.

SUMMARY

An embodiment of the present disclosure provides a display panel, including a substrate and a plurality of pixels provided on the substrate, each of the pixels includes a display region and a transparent region, and a light emitting device is provided in the display region, the display panel further includes a polarization layer, which is provided at a light exiting side of the light emitting device departing from the substrate and provided in the display region and the transparent region, a portion of the polarization layer in the display region is configured to absorb external environment light, and another portion of the polarization layer in the transparent region is configured to transmit the external environment light.

In some implementations, the polarization layer includes a first alignment layer and a guest-host liquid crystal layer, the guest-host liquid crystal layer is provided at a side of the first alignment layer departing from the light emitting device, a portion of the first alignment layer in the display region has a first alignment direction, so that, in a plane perpendicular to a light exiting surface of the display panel, an included angle between an absorption axis of each of liquid crystal molecules in the guest-host liquid crystal layer and a direction parallel to the light exiting surface of the display panel is less than 90°, and another portion of the first alignment layer in the transparent region has a second alignment direction, so that, in the plane perpendicular to the light exiting surface of the display panel, the included angle between the absorption axis of each of the liquid crystal molecules in the guest-host liquid crystal layer and the direction parallel to the light exiting surface of the display panel is equal to 90°.

In some implementations, the polarization layer further includes at least one phase difference film module provided at a side of the first alignment layer proximal to the light emitting device, and each phase difference film module includes an alignment layer and a phase difference film.

In some implementations, the at least one phase difference film module includes a first phase difference film module, the first phase difference film module includes a first phase difference film and a second alignment layer, the first phase difference film is provided at a side of the first alignment layer proximal to the light emitting device, the second alignment layer is provided at a side of the first phase difference film proximal to the light emitting device, and the second alignment layer has a third alignment direction to control orientations of liquid crystal molecules of the first phase difference film in a plane parallel to the light exiting surface of the display panel, so that the first phase difference film increases light absorptivity of the guest-host liquid crystal layer.

In some implementations, the at least one phase difference film module further includes a second phase difference film module, the second phase difference film module includes a second phase difference film and a third alignment layer, the second phase difference film is provided at a side of the first alignment layer proximal to the light emitting device, the third alignment layer is provided between the second phase difference film and the first phase difference film, and the third alignment layer has a fourth alignment direction to control orientations of liquid crystal molecules of the second phase difference film in the plane parallel to the light emitting surface of the display, panel, so that the second phase difference film reduces a color shift of the display panel.

In some implementations, the portion of the polarization layer in the display region includes a first alignment layer and a guest-host liquid crystal layer, the portion of the polarization layer in transparent region includes a first transparent filling layer which is provided in a same layer as the first alignment layer and the guest-host liquid crystal layer, the guest-host liquid crystal layer is provided at a side of the first alignment layer departing from the light emitting device, and the first alignment layer has a first alignment direction so that, in a plane perpendicular to a light exiting surface of the display panel, an included angle between an absorption axis of each of liquid crystal molecules in the guest-host liquid crystal layer and a direction parallel to the light exiting surface of the display panel is less than 90°.

In some implementations, the portion of the polarization layer in the display region further includes at least one phase difference film module provided at a side of the first alignment layer proximal to the light emitting device, the portion of the polarization layer in the transparent region further includes a transparent filling layer provided in a same layer as the phase difference film module, and each phase difference film module includes an alignment layer and a phase difference film.

In some implementations, the at least one phase difference film module includes a first phase difference film module, the first phase difference film module includes a first phase difference film and a second alignment layer, the portion of the polarization layer in the transparent region further includes a second transparent filling layer in a same layer as the first phase difference film module, the first phase difference film is provided at a side of the first alignment layer proximal to the light emitting device, the second alignment layer is provided at a side of the first phase difference film proximal to the light emitting device, and the second alignment layer has a third alignment direction to control orientations of liquid crystal molecules of the first phase difference film in a plane parallel to the light exiting surface of the display panel, so that the first phase difference film increases light absorptivity of the guest host liquid crystal layer.

In some implementations, the at least one phase difference film module further includes a second phase difference film module, the second phase difference film module includes a second phase difference film and a third alignment layer, the portion of the polarization layer located in the transparent region further includes a third transparent filling layer provided in a same layer as the second phase difference film module, the second phase difference film is provided at a side of the first alignment layer proximal to the light emitting device, the third alignment layer is provided between the second phase difference film and the first phase difference film, and the third alignment layer has a fourth alignment direction to control orientations of liquid crystal molecules of the second phase difference film in the plane parallel to the light exiting surface of the display panel, so that the second phase difference film reduces a color shift of the display panel.

In some implementations, the first phase difference film includes a quarter-wave phase difference film.

In some implementations, the second phase difference film includes a half-wavelength phase difference film.

In some implementations, the third alignment direction of the second alignment layer is different from the fourth alignment direction of the third alignment layer, and the orientations of liquid crystal molecules of the first phase difference film are different from the orientations of liquid crystal molecules of the second phase difference film.

In some implementations, a driving device and a metal wire are further provided in the display region, the driving device is provided at a side of the light emitting device departing from the light exiting side of the light emitting device and proximal to the substrate, and the metal wire includes a portion extending from electrode layers or a connection wire of the driving device.

In some implementations, in the display region, the included angle between the absorption axis of each of liquid crystal molecules in the guest-host liquid crystal layer and the direction parallel to the light exiting surface of the display panel is equal to 0°.

An embodiment of the present disclosure further provides a display device, which includes the display panel described above.

An embodiment of the present disclosure further provides a method for manufacturing a display panel, where the display panel includes a substrate and a plurality of pixels provided on the substrate, each of the pixels includes a display region and a transparent region, and the method includes: forming a light emitting device in the display region; and forming a polarization layer in the display region and the transparent region and at a light exiting side of the light emitting device departing from the substrate, a portion of the polarization layer in the display region is formed to absorb external environment light, and another portion of the polarization layer in the transparent region is formed to transmit the external environment light.

DESCRIPTION OF EMBODIMENTS

In order to make technical solutions and advantages of the present disclosure clear, the technical solutions of the present disclosure will be described in further detail below with reference to the accompanying drawings. All other embodiments obtained by a person of ordinary skill in the art based on the embodiments in the present disclosure without making creative efforts fall into the protection scope of the present disclosure.

Shapes and sizes of components in the drawings are not to be considered true scale, but are merely for facilitating understanding contents of the embodiments of the present disclosure.

Figure 1:
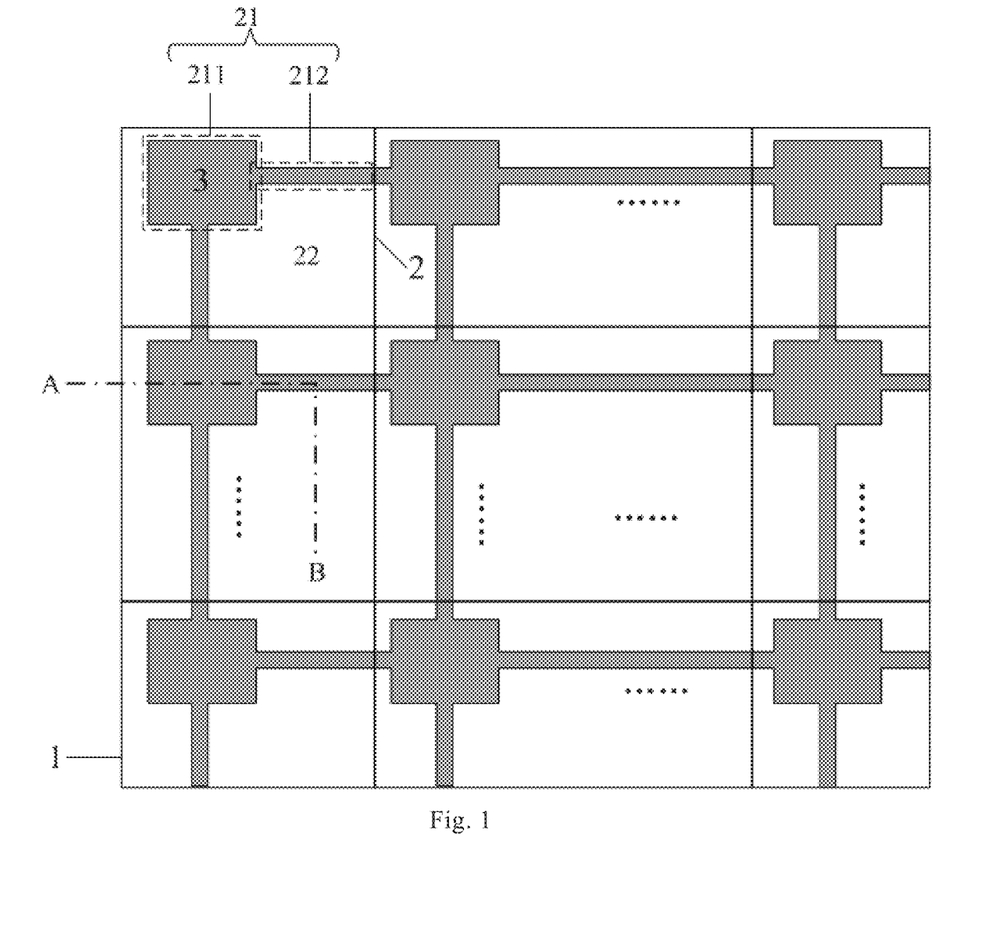
FIG. 1 is a schematic top view of a display panel provided in an embodiment of the present disclosure.

As shown in FIG. 1, an embodiment of the present disclosure provides a display panel, which includes a substrate 1 and a plurality of pixels 2 provided on the substrate 1, each of the pixels 2 includes a display region 21 and a transparent region 22, and the display region 21 further includes a light emitting region 211 and a metal wiring region 212.

Figure 2:
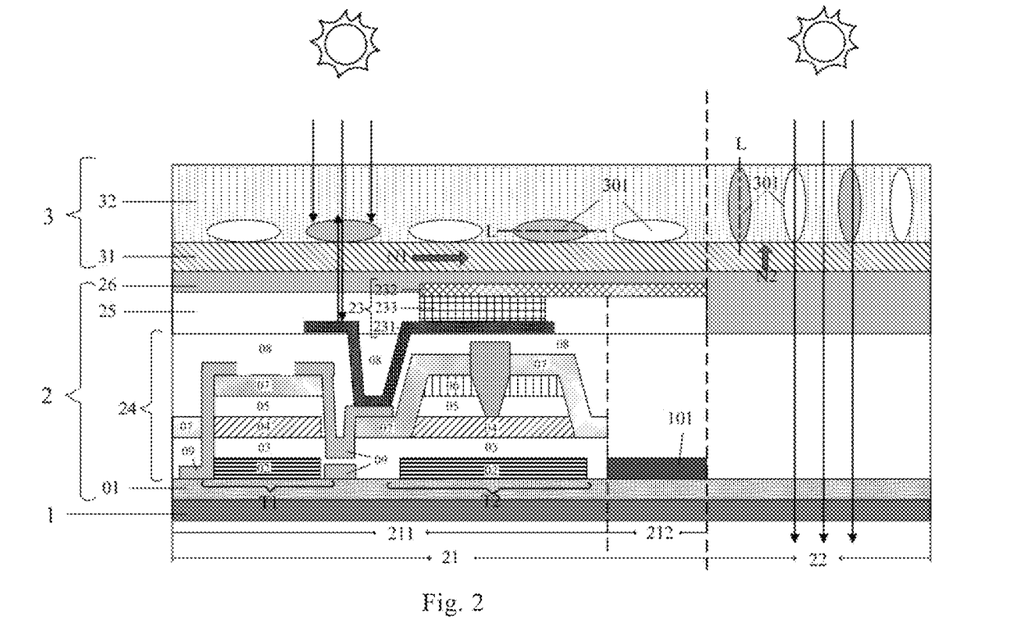
FIG. 2 is a cross-sectional view of a display panel provided in an embodiment of the present disclosure, taken along a direction A-B in FIG. 1.

FIG. 2 is a cross-sectional view of the display panel of the embodiment of the present disclosure, taken along the direction A-B in FIG. 1. As shown in FIG. 2, a light emitting device 23 and a driving device 24 for driving the light emitting device 23 may be provided in the light emitting region 211, the driving device 24 is provided at a side of the light emitting device 23 proximal to the substrate 1, and a metal wire 101 is provided in the metal wiring region 212.

The display panel of the embodiment of the present disclosure further includes a polarization layer 3 provided at a side of the light emitting device 23 departing from the substrate 1, a portion of the polarization layer 3 in the display region 21 is capable of absorbing external environment light, and another portion of the polarization layer 3 in the transparent region 22 is capable of transmitting the external environment light.

As shown in FIG. 2, the light emitting device 23 may include a first electrode 231, a second electrode 232, and a light emitting layer 233 provided between the first electrode 231 and the second electrode 232. The first electrode 231 is provided at a side of the light emitting layer 233 proximal to the substrate 1 and is coupled to the driving device 24, the second electrode 232 is provided at a side of the light emitting layer 232 departing from the substrate 1, and light emitted from the light emitting layer 233 can exit by transmitting the second electrode 232.

The display panel provided by the embodiment of the present disclosure may be a top-emitting type or a bottom-emitting type, the first electrode 231 may be an anode, and the second electrode 232 may be a cathode, alternatively, the first electrode 231 may be the cathode, and the second electrode 232 may be the anode, which may be designed according to actual requirements, and is not limited herein.

During usage of the display panel, after the external environment light is transmitted into the display panel, the driving device 24 and the light emitting device 23 in the display region 21 of the pixel 2 reflect the external environment light irradiated to surfaces thereof, and the external environment light is mainly reflected by the second electrode 232 in the light emitting device 23. In the display panel provided by the embodiment of the present disclosure, the polarization layer 3 can perform different processes respectively on the external environment light in the display region 21 and the external environment light in the transparent region 22, the external environment light is absorbed in the display region 21, and the external environment light is transmitted in the transparent region 22, so that a light reflectivity of the display region 21 can be reduced, and a light transmissivity of the transparent region 22 is not affected, thereby a display effect of the display panel is improved, and a transparency of the transparent display panel is not affected.

It should be noted that, in the display panel provided in the embodiment of the present disclosure, the driving device 24 may adopt a passive matrix (PM) mode, an active matrix (AM) mode, or a semi-active matrix mode, and may be designed as required, which is not limited herein. The embodiment of the present disclosure is explained by taking an example in which the driving device 24 adopts the AM mode.

As shown in FIG. 2, taking the driving device 24 adopting the AM mode as an example, the driving device 24 may include two thin film transistors, such as a first thin film transistor T1 and a second thin film transistor T2, for driving the light emitting device 23. A buffer layer 01 may be provided at a side of the substrate 1 proximal to the light emitting device 23, T1, T2 may include a polysilicon layer (P-Si) 02 provided at a side of the buffer layer 01 departing from the substrate 1, a first gate insulating layer (GI) 03 provided at a side of the P-Si 02 departing from the substrate 1, a first gate electrode (Gate) 04 provided over the GI 03, a second gate insulating layer (GI) 05 provided over the Gate 04, a second gate electrode (Gate) 06 provided over the GI 05, an interlayer insulating layer (ILD) 07 provided over the Gate 06, and a planarization layer (PLN) 08 provided over the ILD 07, the PLN 08 may have a connection wire (SD) 09 provided therein, the SD 09 may be coupled to the GI 04 through vias in the ELI) 07, the GI 05 and the GI 03, the first electrode 231 in the light emitting device 23 may be coupled to the SD 09 through a via in the PLN 08, so that the driving device 24 is coupled to the light emitting device 23 to enable the driving device 24 to drive the light emitting device 23 to emit light.

The metal wire 101 may include a portion extending from electrode layers (e.g., Gate 04 and Gate 06) or a connection wire (e.g., SD 09) in the thin film transistor of the driving device 24, the metal wire 101 is configured to coupling adjacent ones of the pixels 2, and the pixels 2 are coupled together through the metal wire 101 to form a pixel layer of the display panel.

As shown in FIG. 2, the polarization layer 3 may include a first alignment layer 31 and a guest-host liquid crystal layer 32, The guest-host liquid crystal layer 32 is provided at a side of the first alignment layer 31 departing from the substrate 1. The first alignment layer 31 is configured to control an orientation of liquid crystal molecules 301 in the guest-host liquid crystal layer 32.

Specifically, a portion of the first alignment layer 31 in the display region 21 of the pixel 2 has a first alignment direction N1 such that, in a plane perpendicular to the substrate 1, an included angle between an absorption axis L of the liquid crystal molecules 301 in the guest-host liquid crystal layer 32 and a direction parallel to the substrate 1 is less than 90°, for example, as shown in FIG. 2, the included angle between the absorption axis L of each of the liquid crystal molecules 301 and the direction parallel to the substrate 1 is equal to 0°. A portion of the first alignment layer 31 in the transparent region 22 of the pixel 2 has a second alignment direction N2 such that, in the plane perpendicular to the substrate 1, the included angle between the absorption axis L of each of the liquid crystal molecules 301 in the guest-host liquid crystal layer 32 and the direction parallel to the substrate 1 is equal to 90°.

Figure 3:
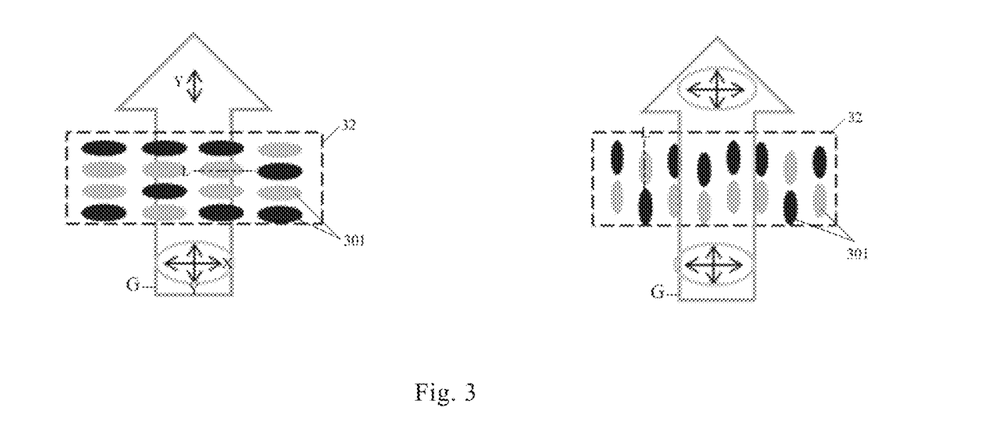
FIG. 3 is a schematic diagram of principle of a guest-host liquid crystal layer in a display panel provided in an embodiment of the present disclosure.

It should be noted that, the guest-host liquid crystal layer 32 includes a composition of dichroic dye and polymerizable liquid crystal molecules. As shown in FIG. 3, the dichroic dye has an absorption axis L, and if the absorption axis L of the dichroic dye extends in a direction parallel to the substrate 1, when external environmental light G is irradiated onto the dichroic dye, a light vector X of the external environmental light G parallel to the absorption axis L of the dichroic dye is absorbed by the dichroic dye, and a light vector Y of the external environmental light G perpendicular to the absorption axis L of the dichroic dye would transmit through the dichroic dye (as shown in left side of FIG. 3), and if the absorption axis L of the dichroic dye extends in a direction perpendicular to the substrate 1, the external environmental light G would directly transmit through the dichroic dye (as shown in right side of FIG. 3). The dichroic dye may be grafted to the liquid crystal molecules 301 by a branch chain; so that the liquid crystal molecules 301 have dichroism. Therefore, in the display panel provided by the embodiment of the present disclosure, the included angle between the absorption axis L of each of the liquid crystal molecules 301 in the portion of the guest-host liquid crystal layer 32 located in the display region 21 of the pixel 2 and the direction parallel to the substrate 1 is less than 90°, when the external environment light G is irradiated onto the display panel, since the included angle between the absorption axis L of each of the liquid crystal molecules 301 located in the display region 21 and the direction parallel to the substrate 1 is not a right angle, at least a portion of the light is absorbed by the liquid crystal molecules 301 having dichroism, thereby reducing the external environment light G irradiated onto the driving device 24 and the light emitting device 23, further reducing the light reflected by the driving device 24 and the light emitting device 23, and thus reducing light reflectivity of the display region 21. The included angle between the absorption axis L of each of the liquid crystal molecules 301 in the portion of the guest-host liquid crystal layer 23 located in the transparent region 22 of the pixel 2 and the direction parallel to the substrate 1 is equal to 90°, when the external environment light G is irradiated onto the display panel, since the absorption axis L of each of the liquid crystal molecules 301 located in the transparent region 22 is perpendicular to the direction parallel to the substrate 1, the light transmissivity of the liquid crystal molecules 301 is maximum at this time, and thus the external environment light G can directly transmit through the liquid crystal molecules 301 without being absorbed by the liquid crystal molecules 301, thereby not affecting the transparency of the transparent region 22 of the pixel 2.

In some implementations, as shown in FIG. 2, the included angle between the absorption axis L of each of the liquid crystal molecules 301 in the portion of the guest-host liquid crystal layer 23 located in the display region 21 of the pixel 2 and the direction parallel to the substrate 1 may be, for example, 0°, that is, the absorption axis L of each of the liquid crystal molecules 301 located in the display region 21 of the pixel 2 is parallel to the plane in which the substrate 1 is located, when the light absorptivity of the liquid crystal molecules 301 is maximum, when the external environment light is irradiated onto the display panel, the light absorptivity of the liquid crystal molecules 301 in the portion of the guest-host liquid crystal layer 23 located in the display region 21 of the pixel 2 to the external environment light is maximum, so that the light reflectivity of the display region 21 can be reduced more.

In some implementations, the polarization layer 3 may further include at least one phase difference film module, which may be provided at a side of the first alignment layer 31 proximal to the substrate 1. The phase difference film module may include an alignment layer and a phase difference film. If multiple phase difference film modules are provided, alignment directions of alignment layers in the phase difference film modules may be different from each other, and phase difference films of the phase difference film modules may respectively have liquid crystal molecules with different orientations.

Figure 4:
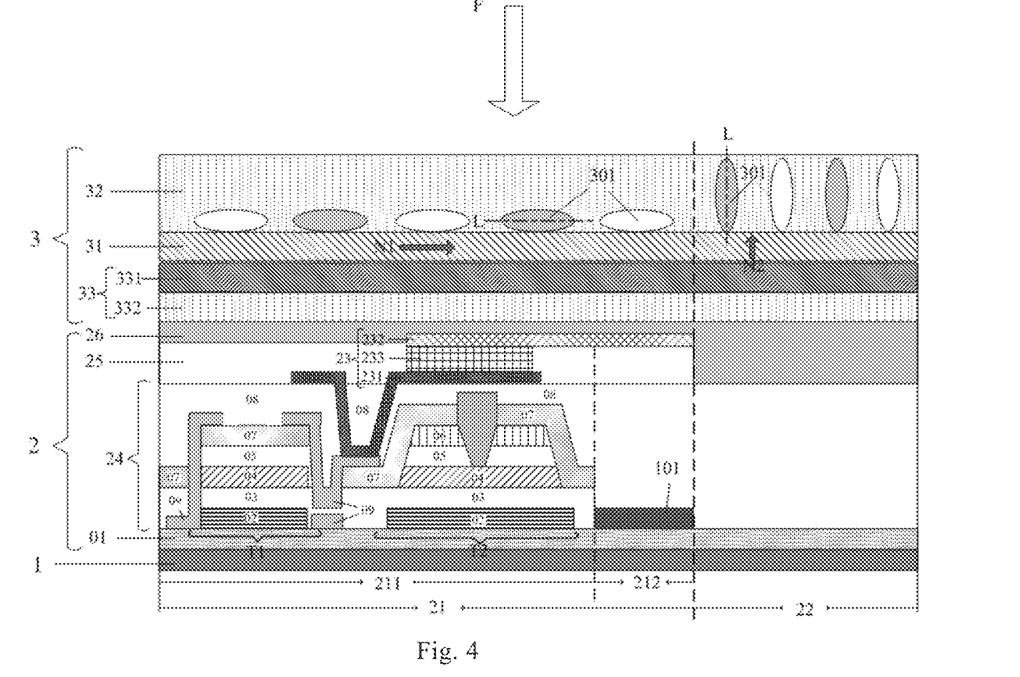
FIG. 4 is a cross-sectional view of a display panel provided in an embodiment of the present disclosure, taken along the direction A-B in FIG. 1.

FIG. 4 is a cross-sectional view of the display panel of the embodiment of the present disclosure, taken along the direction A-B in FIG. 1, As shown in FIG. 4, the at least one phase difference film module may include a first phase difference film module 33, and the first phase difference film module 33 may include a first phase difference film 331 and a second alignment layer 332.

Specifically, the first phase difference film 331 may be provided at a side of the first alignment layer 31 proximal to the substrate 1, orientations of the liquid crystal molecules in the first phase difference film 331 are uniform in the display region 21 and the transparent region 22 of the pixel 2, the second alignment layer 332 is provided at a side of the first phase difference film 331 proximal to the substrate 1, and alignment directions of the second alignment layer 332 in the display region 21 and the transparent region 22 of the pixel 2 are the same. The second alignment layer 332 has a third alignment direction N3, and the second alignment layer 332 controls the orientation of liquid crystal molecules of the first phase difference film 331 in the plane parallel to the substrate 1 according to the third alignment direction N3, so that the first phase difference film 331 can increase the light absorptivity of the guest-host liquid crystal layer 32.

Specifically, referring to FIG. 4, in the display region 21 of the pixel after the external environmental light transmits through the guest-host liquid crystal layer 32 and the first alignment layer 31, since a portion of the external environmental light parallel to the absorption axis L of each of the liquid crystal molecules 301 in the guest-host liquid crystal layer 32 is absorbed and another portion of the external environmental light perpendicular to the absorption axis L of each of the liquid crystal molecules 301 in the guest-host liquid crystal layer 32 is transmitted through, the external environmental light transmitting through the guest-host liquid crystal layer 32 and the first alignment layer 31 becomes a first linearly polarized light which has a direction perpendicular to the absorption axis L of each of the liquid crystal molecules 301 in the guest-host liquid crystal layer 32, the first linearly polarized light becomes an elliptically polarized light after transmitting through the first phase difference film 331, the elliptically polarized light is irradiated onto the light emitting device 23 and the driving device 24, and after being reflected by the light emitting device 23 and the driving device 24, the elliptically polarized light transmits through the first phase difference film 331 again to become a second linearly polarized light which has a direction parallel to the absorption axis L of each of the liquid crystal molecules 301 in the guest-host liquid crystal layer 32, so that the second linearly polarized light is absorbed by the liquid crystal molecules 301 in the guest-host liquid crystal layer 32. The direction of the first linearly polarized light is perpendicular to the direction of the second linearly polarized light. That is, after the external environment light is changed into the first linearly polarized light through a first absorption by the guest-host liquid crystal layer 32, the first linearly polarized light transmits through the first phase difference film 331 both before being irradiated onto the light emitting device 23 and the driving device 24 and after being reflected by the light emitting device 23 and the driving device 24, so that the first phase difference film 331 changes the first linearly polarized light perpendicular to the absorption axis L of each of the liquid crystal molecules 301 in the guest-host liquid crystal layer 32 into the second linearly polarized light parallel to the absorption axis L of each of the liquid crystal molecules 301 in the guest-host liquid crystal layer 32, and then the second linearly polarized light is absorbed by the guest-host liquid crystal layer 32, and thus, the first phase difference film 331 can increase the light absorptivity of the guest-host liquid crystal layer 32, thereby further reducing the light reflectivity of the display region 21 of the pixel 2. In the transparent region 22 of the pixel 2, unlike the liquid crystal molecules 301 in the guest-host liquid crystal layer 32, the liquid crystal molecules 301 in the first phase difference film 331 do not have dichroism, and thus, the external environment light irradiated onto the first phase difference film 331 is not absorbed by the first phase difference film 331, and the external environment light can directly transmit through the first phase difference film 331, thereby not affecting the transparency of the transparent region 22 of the pixel 2.

In some implementations, the first phase difference film 331 may be, for example, a quarter-wave phase difference film.

Figure 5:
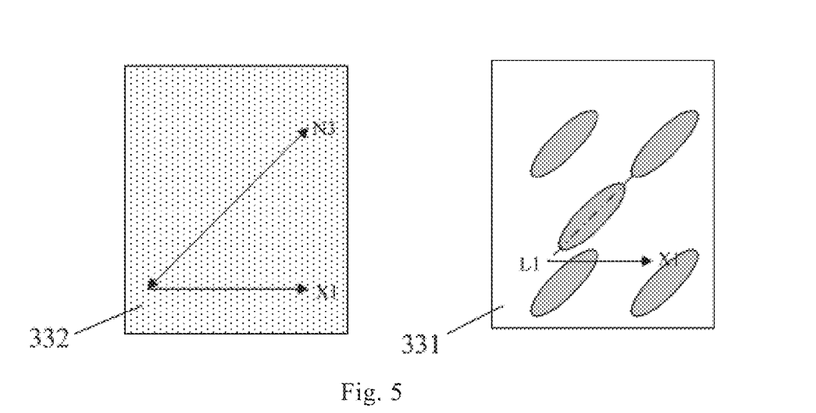
FIG. 5 is a schematic configuration diagram of a first phase difference film module in a display panel provided in an embodiment of the present disclosure.

FIG. 5 is a schematic configuration view of the first phase difference film module 33. For example, the first phase difference film 331 is a quarter-wave phase difference film, and as shown in FIG. 5, an included angle between the third alignment direction N3 of the second alignment layer 332 and the direction X1 parallel to the display panel is equal to 45°, and accordingly, an included angle between the long axis L1 of each of the liquid crystal molecules in the first phase difference film 331 and the direction X1 parallel to the display panel is equal to 45°.

Figure 6:
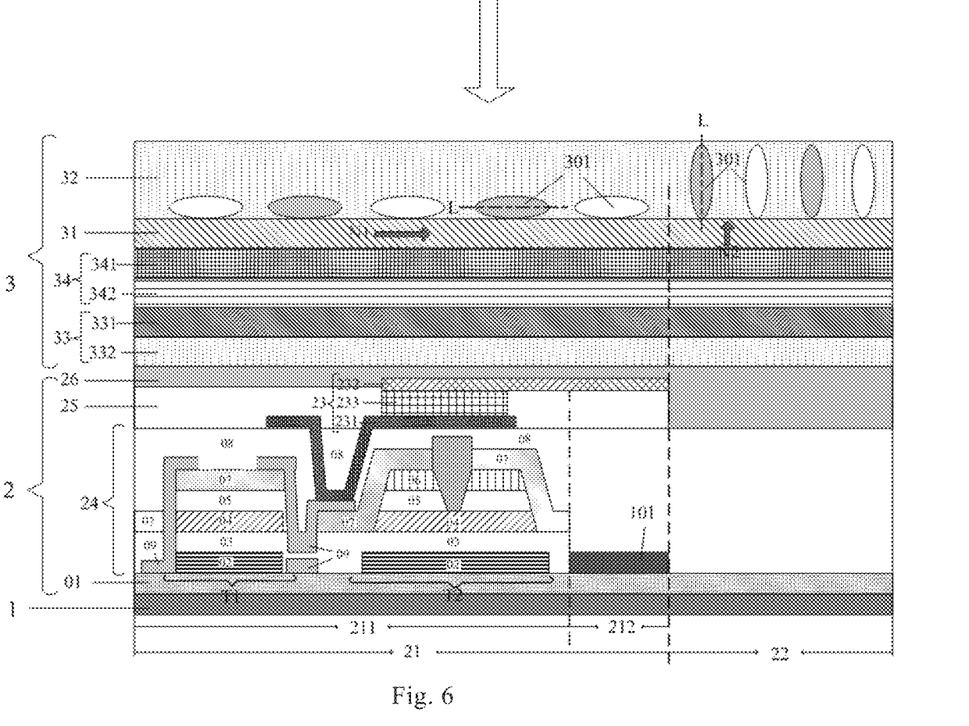
FIG. 6 is a cross-sectional view of a display panel provided in an embodiment of the present disclosure, taken along the direction A-B in FIG. 1.

FIG. 6 is a cross-sectional view of the display panel of the embodiment of the present disclosure, taken along the direction A-B in FIG. 1. As shown in FIG. 6, the at least one phase difference film module may further include a second phase difference film module 34, and the second phase difference film module 34 may include a second phase difference film 341 and a third alignment layer 342.

Specifically, the second phase difference film 341 may be provided at a side of the first alignment layer 31 proximal to the substrate 1, orientations of the liquid crystal molecules of the second phase difference film 341 are uniform in the display region 21 and the transparent region 22 of the pixel 2, the third alignment layer 342 is provided between the second phase difference film 341 and the first phase difference film 331, and alignment directions of the third alignment layer 342 in the display region 21 and the transparent region 22 of the pixel 2 are the same. The third alignment layer 342 has a fourth alignment direction N4, and the third alignment layer 342 controls the orientations of liquid crystal molecules of the second phase difference film 341 in the plane parallel to the substrate 1 according to the fourth alignment direction N4, so that the second phase difference film 341 can reduce the color shift of the display panel.

Specifically, in the display panel provided by the embodiment of the present disclosure, in the display region 21 of the pixel 2, since the external environment light may become monochromatic light due to a phase delay after transmitting through the guest-host liquid crystal layer 32 and the first phase difference film 331, a color shift of the display panel may occur after the external environment light being reflected by the light emitting device 23 and the driving device 24, and the second phase difference film 341 is added between the guest-host liquid crystal layer 32 and the first phase difference film 331, thus after the external environment light is changed into the first linearly polarized light by transmitting through the guest host liquid crystal layer 32, the first linearly polarized light transmits through the second phase difference film 341 and the second phase difference film 341 deflects the first linearly polarized light, and by cooperating with the first phase difference film 331, a deflection direction of the first linearly polarized light may be changed, thereby improving the problem of color shift. In the transparent region 22 of the pixel 2, unlike the liquid crystal molecules 301 in the guest-host liquid crystal layer 32, the liquid crystal molecules in the second phase difference film 341 do not have dichroism, and thus, the external environment light irradiated onto the second phase difference film 341 is not absorbed by the second phase difference film 341, and the external environment light can directly transmit through the second phase difference film 341 without affecting the transparency of the transparent region 22 of the pixel 2.

In some implementations, the second phase difference film 341 may be, for example, a half wavelength phase difference film.

Figure 7:
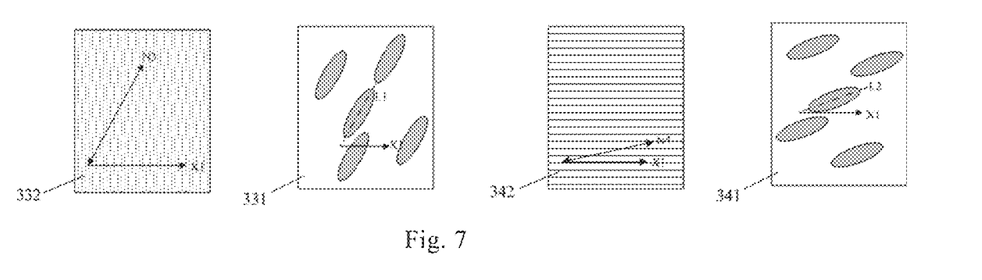
FIG. 7 is a schematic configuration diagram of a first phase difference film module and a second phase difference film module in a display panel provided in an embodiment of the present disclosure.

FIG. 7 is a schematic configuration diagram of the first phase difference film module 33 and the second phase difference film module 34. For example, the first phase difference film 331 is a quarter-wavelength phase difference film, the second phase difference film 341 is a half-wavelength phase difference film, an included angle between the third alignment direction N3 of the second alignment layer 1332 and the direction X1 parallel to the display panel may be equal to 75°, and accordingly, an included angle between the long axis L1 of each of the liquid crystal molecules in the first phase difference film 331 and the direction X1 parallel to the display panel is equal to 75°, an included angle between the fourth alignment direction N4 of the third alignment layer 342 and the direction X1 parallel to the display panel may be equal to 15°, and accordingly, an included angle between the long axis L2 of each of the liquid crystal molecules in the second phase difference film 341 and the direction X1 parallel to the display panel is equal to 15°.

It should be noted that there are many implementations of a combination and the number of the phase difference film module(s) in the polarization layer 3, the present disclosure only shows some examples, and those skilled in the art may make modifications and variations as required, which are not described one by one herein.

In some implementations, in order to enable the portion of the polarization layer 3 located in the display region 21 to absorb the external environment light and the portion of the polarization layer 3 located in the transparent region 22 to transmit the external environment light, the portion of the polarization layer 3 located in the display region 21 may include, for example, the guest-host liquid crystal layer, the phase difference film, or the like, and the portion of the polarization layer 3 located in the transparent region 22 may be filled with a transparent organic material.

Figure 8:
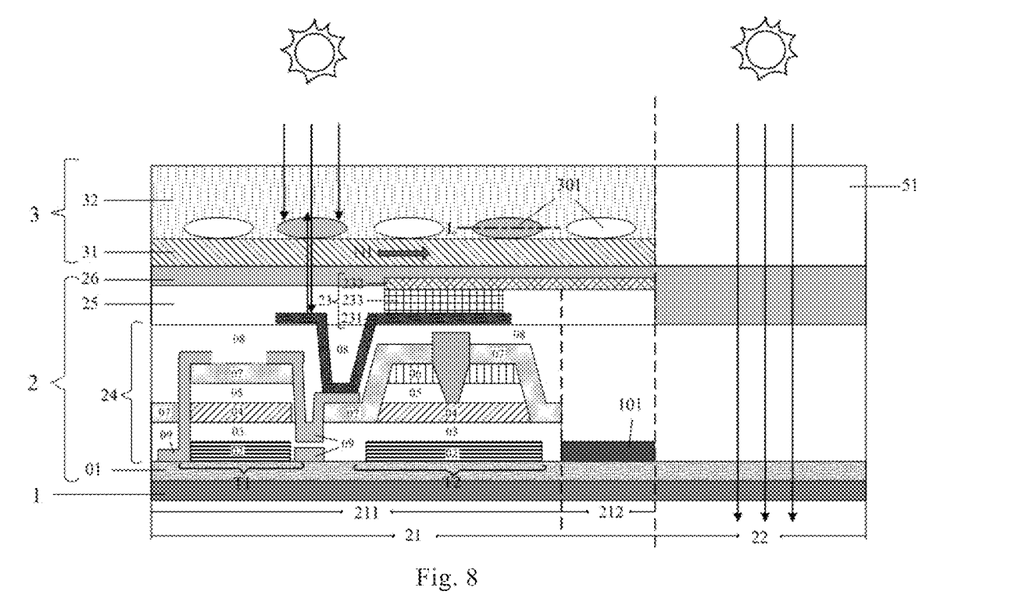
FIG. 8 is a cross-sectional view of a display panel provided in an embodiment of the present disclosure, taken along the direction A-B in FIG. 1.

FIG. 8 is a cross-sectional view of the display panel of the embodiment of the present disclosure, taken along the direction A-B in FIG. 1. As shown in FIG. 8, the portion of the polarization layer 3 located in the display region 21 of the pixel 2 may include the first alignment layer 31 and the guest-host liquid crystal layer 32, and the portion of the polarization layer 3 located in the transparent region 22 of the pixel 2 may include a first transparent filling layer 51 provided in the same layer as the first alignment layer 31 and the guest-host liquid crystal layer 32. The guest-host liquid crystal layer 32 may be provided at the side of the first alignment layer 31 departing from the substrate 1. The first alignment layer 31 is configured to control the orientations of the liquid crystal molecules 301 in the guest-host liquid crystal layer 32.

Specifically, the first alignment layer 31 is provided only in the display region 21 of the pixel 2, and the first alignment layer 31 has the first alignment direction N1 such that, in the plane perpendicular to the substrate 1, an included angle between the absorption axis L of each of the liquid crystal molecules 301 in the guest-host liquid crystal layer 32 and the direction parallel to the substrate 1 is less than 90°.

The liquid crystal molecules 301 in the guest-host liquid crystal layer 32 have dichroism, and thus, the guest-host liquid crystal layer 32 is only provided in the display region 21 of the pixel 2, and the included angle between the absorption axis L of each of the liquid crystal molecules 301 in the guest-host liquid crystal layer 32 and the direction parallel to the substrate 1 is less than 90°, when the external environment light is irradiated onto the display, panel, since the absorption axis L of each of the liquid crystal molecules 301 is not perpendicular to the direction parallel to the substrate 1, at least a portion of the light is absorbed by the liquid crystal molecules 301 having dichroism, thereby reducing the external environment light irradiated onto the driving device 24 and the light emitting device 23, further reducing the light reflected by the driving device 24 and the light emitting device 23, and thus reducing the light reflectivity of the display region 21. In the transparent region 22 of the pixel 2, the first transparent filling layer 51 is provided in the same layer as the first alignment layer 31 and the guest-host liquid crystal layer 32, and the first transparent filling layer 51 is made of, for example, a transparent organic material, so that when the external environment light is irradiated onto the display panel, the first transparent filling layer Si can be directly transmitted through without affecting the transparency of the transparent region 22 of the pixel 2.

In some implementations, as shown in FIG. 8, the included angle between the absorption axis L of each of the liquid crystal molecules 301 in the guest-host liquid crystal layer 32 and the direction parallel to the substrate 1 may be, for example, equal to 0°, that is, the absorption axis L of each of the liquid crystal molecules 301 in the guest-host liquid crystal layer 32 is parallel to the plane of the substrate 1, where the light absorptivity of the liquid crystal molecules 301 is maximum, and when the external environment light is irradiated onto the display panel, the light absorptivity of the liquid crystal molecules 301 in the guest-host liquid crystal layer 32 to the external environment light is maximum, so that the light reflectivity of the display region 21 can be reduced more.

In some implementations, the portion of the polarization layer 3 in the display region 21 of the pixel 2 may further include at least one phase difference film module, which may be provided at a side of the first alignment layer 31 proximal to the substrate 1, and the portion of the polarization layer 3 in the transparent region 22 may further include a transparent filling layer provided in the same layer as the phase difference film module. The phase difference film module includes an alignment layer and a phase difference film. If multiple phase difference modules are provided, alignment directions of alignment layers in the phase difference film modules may be different from each other, and phase difference films of the phase difference film modules may respectively have liquid crystal molecules with different orientations.

Figure 9:
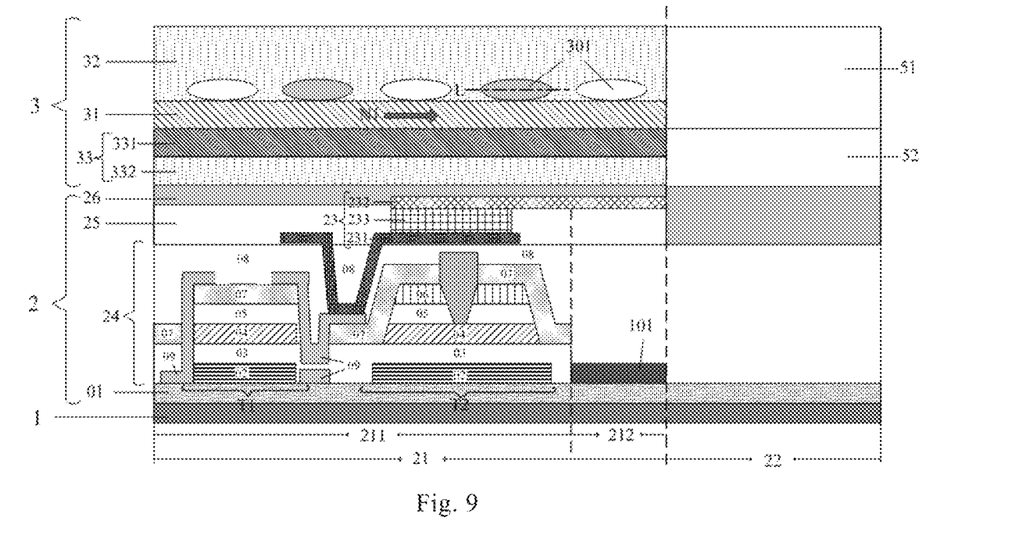
FIG. 9 is a cross-sectional view of a display panel provided in an embodiment of the present disclosure, taken along the direction A-B in FIG. 1.

FIG. 9 is a cross-sectional view of the display panel of the embodiment of the present disclosure, taken along the direction A-B in FIG. 1. As shown in FIG. 9, in the portion of the polarization layer 3 located in the display region 21 of the pixel 2, the at least one phase difference film module may include the first phase difference film module 33, the first phase difference film module 33 includes the first phase difference film 331 and the second alignment layer 332, and the portion of the polarization layer 3 located in the transparent region 22 of the pixel 2 may include a second transparent filling layer 52 provided in the same layer as the first phase difference film module 33.

Specifically, the first phase difference film 331 is provided only in the display region 21 of the pixel 2, and the first phase difference film 331 is provided at the side of the first alignment layer 31 proximal to the substrate 1, and the second alignment layer 332 is provided at the side of the first phase difference film 331 proximal to the substrate 1. The second transparent filling layer 52 is provided at a side of the first transparent filling layer 51 proximal to the substrate 1. The second alignment layer 332 has the third alignment direction N3, and the second alignment layer 332 controls the orientations of liquid crystal molecules of the first phase difference film 331 in the plane parallel to the substrate 1 according to the third alignment direction N3, so that the first phase difference film 331 can increase the light absorptivity of the guest-host liquid crystal layer 32.

Therefore, in the display region 21 of the pixel 2, the first phase difference film 331 can increase the light absorptivity of the guest-host liquid crystal layer 32, thereby further reducing the light reflectivity of the display region 21 of the pixel 2; and in the transparent region 22 of the pixel 2, the second transparent filling layer 52 is provided in the same layer as the first phase difference film 331 and the second alignment layer 332, and the second transparent filling layer 52 is made of, for example, a transparent organic material, so that when the external environment light is irradiated onto the display panel, the external environment light can directly transmit through the second transparent filling layer 52, and thus the transparency of the transparent region 22 of the pixel 2 is not affected.

Figure 10:
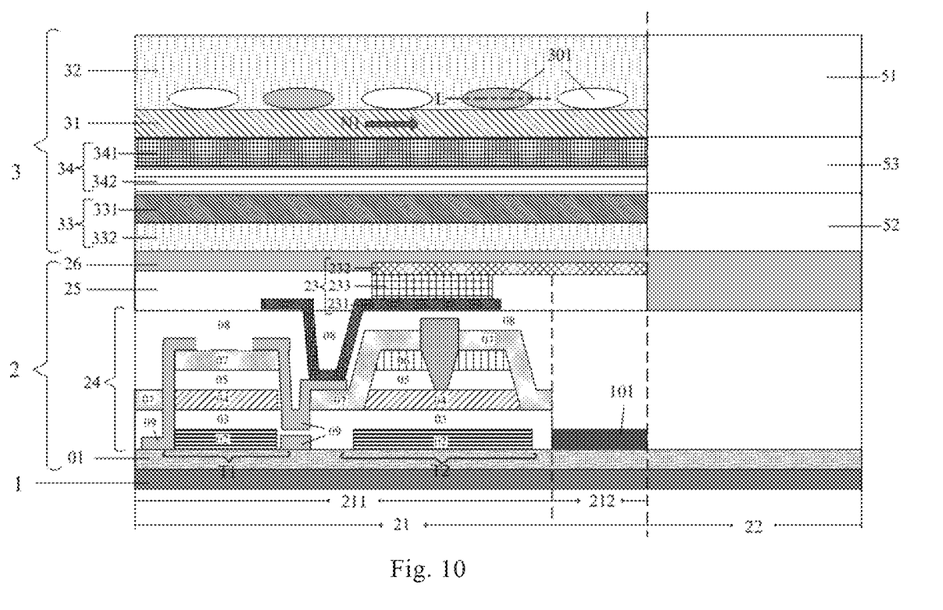
FIG. 10 is a cross-sectional view of a display panel provided in an embodiment of the present disclosure, taken along the direction A-B in FIG. 1.

FIG. 10 is a cross-sectional view of the display panel of the embodiment of the present disclosure, taken along the direction A-B in FIG. 1. As shown in FIG. 10, in the portion of the polarization layer 3 located in the display region 21 of the pixel 2, the at least one phase difference film module may further include the second phase difference film module 34, the second phase difference film module 34 may include the second phase difference film 341 and the third alignment layer 342, and the portion of the polarization layer 3 located in the transparent region 22 of the pixel 2 may further include a third transparent filling layer 53 provided in the same layer as the second phase difference film module 34.

Specifically, the second phase difference film 341 may b provided at a side of the first alignment layer 31 proximal to the substrate 1, and the third alignment layer 342 may be provided between the second phase difference film 341 and the first phase difference film 331. The third transparent filling layer 53 is provided between the first transparent filling layer 51 and the second transparent filling layer 52. The third alignment layer 342 has the fourth alignment direction N4, and the third alignment layer 342 controls the orientations of liquid crystal molecules of the second phase difference film 341 in the plane parallel to the substrate 1 according to the fourth alignment direction N4, so that the second phase difference film 341 can reduce the color shift of the display panel.

Therefore, in the display region 21 of the pixel 2, the second phase difference film 341 can improve the problem of color shift of the display panel, and in the transparent region 22 of the pixel 2, the third transparent filling layer 53 is provided in the same layer as the second phase difference film 341 and the third alignment layer 342, and the third transparent filling layer 53 is made of, for example, a transparent organic material, so that when the external environment light is irradiated onto the display panel, the third transparent filling layer 53 can be directly transmitted through without affecting the transparency of the transparent region 22 of the pixel 2.

In some implementations, the material of any transparent filling layer (for example, the first transparent filling layer 51, the second transparent filling layer 52, and/or the third transparent filling layer 53) may be, for example, polyimide (PI), and certainly, any other material may be used alternatively, and is not limited herein, as long as the used material does not affect the transparency of the display panel.

In some implementations, the alignment layer (e.g., the first alignment layer 31) configured to align the liquid crystal molecules 301 in the guest-host liquid crystal layer 32 may include a photo-alignment film including a high molecular polymer having a photosensitizer therein, and the high molecular polymer having the photosensitizer may be made to have an alignment capability by irradiating ultraviolet (UV) rays onto the high molecular polymer having the photosensitizer, thereby implementing an alignment function of the photo-alignment film.

In some implementations, the alignment layer (e.g., the second alignment layer 332, the third alignment layer 342) configured to align the liquid crystal molecules in the phase difference film module may include various types of alignment films, such as a photo-alignment film and a rubbing alignment film, which may be designed as required and is not limited herein.

In some implementations, in the display panel provided by the embodiment of the present disclosure, a pixel defining layer (PDL) 25 may be further provided, the PDL 25 being configured to separate the light emitting regions of the respective light emitting devices 23.

In some implementations, the display panel provided by the embodiment of the present disclosure may further include a thin film encapsulation (TFE) layer 26 provided at a side of the light emitting device 23 departing from the substrate 1, and the TFE 26 may include two inorganic film layers and an organic film layer provided between the two inorganic film layers, the material of the inorganic film layer may be, for example, silicon oxynitride or silicon nitride, and the material of the organic film layer includes a polymer (polymer), for example, polyacrylate, etc., and certainly, alternatively may be any other material and is not limited herein, as long as the transparency of the display panel is not affected.

In some implementations, in the display panel provided by the embodiment of the present disclosure, in the transparent region 22 of the pixel 2, a transparent material may be filled between the substrate 1 and the polarization layer 3, for example, the transparent material may be the same as that of the PLN layer 08 in the pixel 2.

In some implementations, the material of the substrate 1 of the display panel provided in the embodiment of the present disclosure may be, for example, polyimide (PI), and certainly, alternatively may be any other material and is not limited herein, as long as the used material does not affect the transparency of the display panel.

In some implementations, in the display panel provided by the embodiment of the present disclosure, the guest-host liquid crystal layer 32 includes a mixture of liquid crystal molecules and a dichroic dye, the dichroic dye may be a single dichroic dye or a mixture of multiple dichroic dyes, and the dichroic dye has a relatively high solubility in the liquid crystal molecules, which may be selected as required, and is not limited herein.

In some implementations, in the display panel provided by the embodiment of the present disclosure, the dichroic dye may absorb light with a wavelength dispersion between 450 nm and 650 nm, or between 380 nm and 780 nm, which may be designed as required, and is not limited herein.

An embodiment of the present disclosure further provides a display device, which includes the display panel described above. The display device may be any product or component with a display function, such as a mobile phone, a tablet personal computer, a television, a display, a notebook computer, a digital photo frame, a navigator and the like. It should be understood by those skilled in the art that the display device may further include other essential components, which are not used to limit the present disclosure and are not described herein in detail.

An embodiment of the present disclosure further provides a method for manufacturing the display panel described above.

Figure 11:
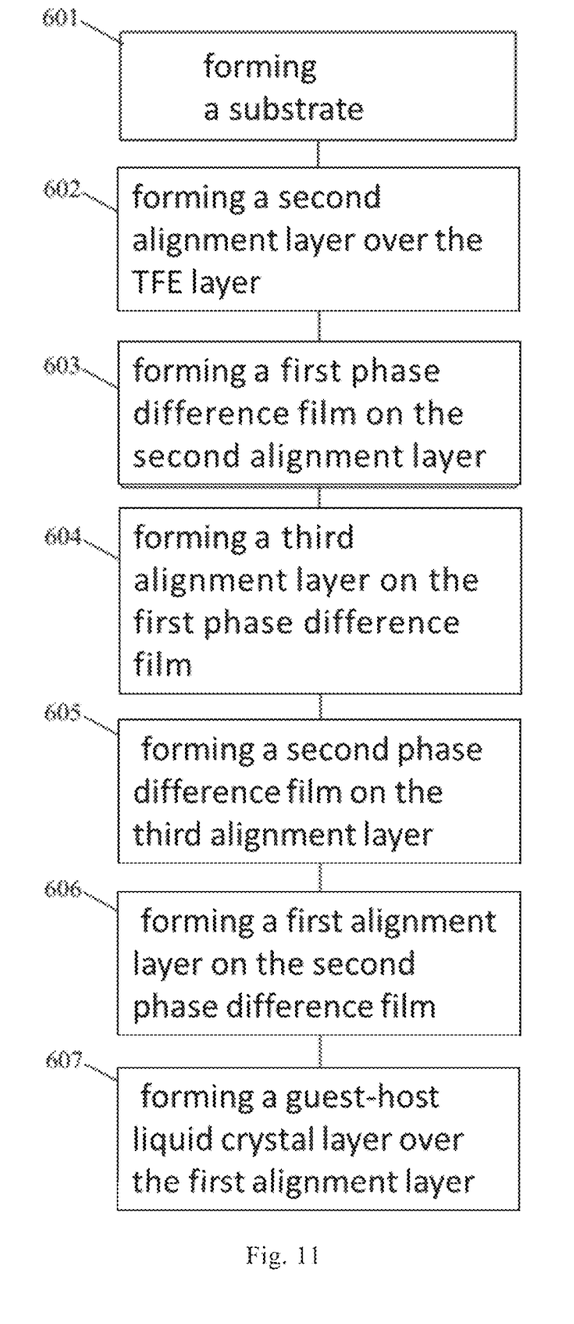
FIG. 11 is a flowchart of a method for manufacturing a display panel according to an embodiment of the present disclosure.

Specifically, taking the display panel including the first phase difference film module and the second phase difference film module as an example, and taking a photo-alignment film being used as the alignment layer in the display panel as an example, as shown in FIG. 11, the method for manufacturing the display panel may include following steps 601 to 607.

In step 601, a substrate is formed, a driving device and a light emitting device are formed on the substrate, and a thin film encapsulation (TFE) layer is formed over the light emitting device for encapsulation.

In step 602, a second alignment layer is formed over the TFE layer.

Specifically, a PI layer is coated on a side of the TFE layer departing from the substrate, and is cured to form a second alignment layer, and then the second alignment layer is irradiated by UV to enable the high molecular polymer in the second alignment layer to have alignment capability and form a third alignment direction of the second alignment layer.

In some implementations, a temperature at which curing is performed may range from 85° C. to 140° C. to protect the light emitting device.

In step 603, a first phase difference film is formed on the second alignment layer.

Specifically, a polymerizable liquid crystal with a quarter-wave phase difference is coated on a side of the second alignment layer departing from the substrate to form the first phase difference film, the first phase difference film is irradiated with UV and is cured, and liquid crystal molecules in the first phase difference film are oriented in the third alignment direction of the second alignment layer.

In step 604, a third alignment layer is formed on the first phase difference film.

Specifically, a PI layer is coated on a side of the first phase difference film departing from the substrate, and is cured to form the third alignment layer, and then the third alignment layer is irradiated with UV to enable the high molecular polymer in the third alignment layer to have alignment capability and form a fourth alignment direction of the third alignment layer.

In step 605, a second phase difference film is formed on the third alignment layer.

Specifically, a polymerizable liquid crystal with a half-wavelength phase difference is coated on a side of the third alignment layer departing from the substrate to form the second phase difference film, the second phase difference film is irradiated with UV and is cured, and liquid crystal molecules in the second phase difference film are oriented in the fourth alignment direction of the third alignment layer.

In step 606, a first alignment layer is formed on the second phase difference film.

Specifically, a PI layer is coated on a side of the second phase difference film departing from the substrate and cured to form the first alignment layer. A mask plate is utilized to cover the portion of the first alignment layer located in the transparent region of the pixel, the portion of the first alignment layer located in the display region of the pixel is irradiated by UV (ultraviolet) so as to enable the high molecular polymer in the portion of the first alignment layer located in the display region to have a first alignment direction. Then, the mask plate is utilized to cover the portion of the first alignment layer located in the display region of the pixel, and the portion of the first alignment layer located in the transparent region of the pixel is irradiated by UV (ultraviolet), so that the high molecular polymer in the portion of the first alignment layer located in the transparent region has a second alignment direction.

In step 607, a guest-host liquid crystal layer is formed over the first alignment layer.

Specifically, a mixture of a dichroic dye and polymerizable liquid crystal molecules is coated on a side of the first alignment layer departing from the substrate to form the guest-host liquid crystal layer, and both ends of each polymerizable liquid crystal molecule may include a photo-polymerization group, and when ultraviolet rays are irradiated to the photo-polymerization group, a polymerization reaction occurs to form the light axes of the liquid crystal molecules. Then, the guest-host liquid crystal layer is irradiated by UV (ultraviolet), and is cured, and to enable the liquid crystal molecules of the guest-host liquid crystal layer located in the display region of the pixel to be oriented in the first alignment direction, and the liquid crystal molecules of the guest-host liquid crystal layer located in the transparent region of the pixel to be oriented in the second alignment direction.

In some implementations, the transparent region of the pixel is filled with a transparent material.

In summary, the polarization layer 3 of the display panel provided in the embodiment of the present disclosure can perform different processes on the external environment light in the display region 21 and the transparent region 22 of the pixel 2, respectively, that is, absorb the external environment light in the display region 21, and transmit the external environment light in the transparent region 22, so that the light reflectivity of the display region 21 can be reduced, and the light transmissivity of the transparent region 22 is not affected, thereby improving the display effect of the display panel and not affecting the transparency of the transparent display panel.

It should be understood that the above implementations and embodiments are merely illustrative to illustrate the principles of the present disclosure, which, however, is not to be taken as limiting the present disclosure. It would be apparent to those skilled in the art that various changes and modifications may be made therein without departing from the spirit and scope of the present disclosure, and these changes and modifications are to be considered within the scope of the present disclosure.

The invention claimed is:

1. A display panel, comprising a substrate and a plurality of pixels provided on the substrate, wherein each of the pixels comprises a display region and a transparent region, a light emitting device is provided in the display region, the display panel further comprises a polarization layer which is provided in the display region and the transparent region and at a light exiting side of the light emitting device departing from the substrate,
   a portion of the polarization layer in the display region is configured to absorb external environment light, and another portion of the polarization layer in the transparent region is configured to transmit the external environment light,
   wherein the polarization layer comprises a first alignment layer and a guest-host liquid crystal layer, the guest-host liquid crystal layer is provided at a side of the first alignment layer departing from the light emitting device, a portion of the first alignment layer located in the display region has a first alignment direction such that, in a plane perpendicular to a light exiting surface of the display panel, an included angle between an absorption axis of each of liquid crystal molecules in the guest-host liquid crystal layer and a direction parallel to the light exiting surface of the display panel is less than 90°, a portion of the first alignment layer located in the transparent region has a second alignment direction such that, in a plane perpendicular to the light exiting surface of the display panel, an included angle between the absorption axis of each of the liquid crystal molecules in the guest-host liquid crystal layer and the direction parallel to the light exiting surface of the display panel is equal to 90°, and
   wherein the polarization layer further comprises at least one phase difference film module provided at a side of the first alignment layer proximal to the light emitting device, each phase difference film module comprising an alignment layer and a phase difference film.

2. The display panel of claim 1, wherein the at least one phase difference film module comprises a first phase difference film module including a first phase difference film and a second alignment layer, the first phase difference film being provided at a side of the first alignment layer proximal to the light emitting device, the second alignment layer being provided at a side of the first phase difference film proximal to the light emitting device, the second alignment layer having a third alignment direction to control orientations of liquid crystal molecules of the first phase difference film in a plane parallel to the light exiting surface of the display panel, so that the first phase difference film increases light absorptivity of the guest-host liquid crystal layer.

3. The display panel of claim 2, wherein the at least one phase difference film module further comprises a second phase difference film module including a second phase difference film and a third alignment layer, the second phase difference film being provided at the side of the first alignment layer proximal to the light emitting device, the third alignment layer being provided between the second phase difference film and the first phase difference film, the third alignment layer having a fourth alignment direction to control orientations of liquid crystal molecules of the second phase difference film in the plane parallel to the light exiting surface of the display panel, so that the second phase difference film reduces a color shift of the display panel.

4. The display panel of claim 3, wherein the second phase difference film comprises a half-wavelength phase difference film.

5. The display panel of claim 3, wherein the third alignment direction of the second alignment layer is different from the fourth alignment direction of the third alignment layer, and the orientations of liquid crystal molecules in the first phase difference film are different from the orientations of liquid crystal molecules in the second phase difference film.

6. The display panel of claim 2, wherein the first phase difference film comprises a quarter-wavelength phase difference film.

7. The display panel of claim 1, wherein a driving device and a metal wire are further provided in the display region, the driving device is provided at a side of the light emitting device departing from the light exiting side thereof and proximal to the substrate, and the metal wire includes a portion extending from electrode layers or a connection wire of the driving device.

8. The display panel of claim 1, wherein, in the display region, the included angle between the absorption axis of each of the liquid crystal molecules in the guest-host liquid crystal layer and the direction parallel to the light exiting surface of the display panel is equal to 0°.

9. A display device, comprising the display panel of claim 1.

10. A display panel, comprising a substrate and a plurality of pixels provided on the substrate, wherein each of the pixels comprises a display region and a transparent region, a light emitting device is provided in the display region, the display panel further comprises a polarization layer which is provided in the display region and the transparent region and at a light exiting side of the light emitting device departing from the substrate, a portion of the polarization layer in the display region is configured to absorb external environment light, and another portion of the polarization layer in the transparent region is configured to transmit the external environment light, wherein the portion of the polarization layer located in the display region comprises a first alignment layer and a guest-host liquid crystal layer, the portion of the polarization layer located in the transparent region comprises a first transparent filling layer which is provided in a same layer as the first alignment layer and the guest-host liquid crystal layer, the guest-host liquid crystal layer is provided at a side of the first alignment layer departing from the light emitting device, the first alignment layer has a first alignment direction, so that, in a plane perpendicular to a light exiting surface of the display panel, an included angle between an absorption axis of each of liquid crystal molecules in the guest-host liquid crystal layer and a direction parallel to the light exiting surface of the display panel is less than 90°, and wherein the portion of polarization layer in the display region further comprises at least one phase difference film module provided at a side of the first alignment layer proximal to the light emitting device, the portion of the polarization layer in the transparent region further comprises a transparent filling layer provided in a same layer as the phase difference film module, and each phase difference film module comprises an alignment layer and a phase difference film.

11. The display panel of claim 10, wherein the at least one phase difference film comprises a first phase difference film module including a first phase difference film and a second alignment layer, the portion of the polarization layer located in the transparent region further comprises a second transparent filling layer provided in a same layer as the first phase difference film module, the first phase difference film is provided at a side of the first alignment layer proximal to the light emitting device, the second alignment layer is provided at a side of the first phase difference film proximal to the light emitting device, the second alignment layer has a third alignment direction to control orientations of liquid crystal molecules of the first phase difference film in a plane parallel to the light exiting surface of the display panel, such that the first phase difference film increases light absorptivity of the guest host liquid crystal layer.

12. The display panel of claim 11, wherein the at least one phase difference film module further comprises a second phase difference film module including a second phase difference film and a third alignment layer, the portion of the polarization layer in the transparent region further comprises a third transparent filling layer provided in a same layer as the second phase difference film module, the second phase difference film is provided at the side of the first alignment layer proximal to the light emitting device, the third alignment layer is provided between the second phase difference film and the first phase difference film, and the third alignment layer has a fourth alignment direction to control orientations of liquid crystal molecules of the second phase difference film in the plane parallel to the light emitting surface of the display panel, so that the second phase difference film reduces a color shift of the display panel.

13. The display panel of claim 12, wherein the second phase difference film comprises a half-wavelength phase difference film.

14. The display panel of claim 12, wherein the third alignment direction of the second alignment layer is different from the fourth alignment direction of the third alignment layer, and the orientations of liquid crystal molecules in the first phase difference film is different from the orientations of liquid crystal molecules in the second phase difference film.

15. The display panel of claim 11, wherein the first phase difference film comprises a quarter-wavelength phase difference film.

16. The display panel of claim 10, wherein, in the display region, the included angle between the absorption axis of each of the liquid crystal molecules in the guest-host liquid crystal layer and the direction parallel to the light exiting surface of the display panel is equal to 0°.

* * * * *